(12) United States Patent
Doyle et al.

(10) Patent No.: US 12,174,241 B2
(45) Date of Patent: Dec. 24, 2024

(54) APPARATUS AND METHOD FOR TIN WHISKER ISOLATION AND DETECTION

(71) Applicant: INTERNATIONAL BUSINESS MACHINES CORPORATION, Armonk, NY (US)

(72) Inventors: Matthew Doyle, Chatfield, MN (US); Jeffrey N. Judd, Oronoco, MN (US); Mark J. Jeanson, Rochester, MN (US); Timothy J. Tofil, Rochester, MN (US); Matthew S. Kelly, Oakville (CA); Henry Michael Newshutz, Rochester, MN (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 112 days.

(21) Appl. No.: 18/147,878

(22) Filed: Dec. 29, 2022

(65) Prior Publication Data
US 2024/0219450 A1    Jul. 4, 2024

(51) Int. Cl.
*G01R 31/28* (2006.01)
*G01R 1/18* (2006.01)
*G01R 33/07* (2006.01)

(52) U.S. Cl.
CPC ........... *G01R 31/2813* (2013.01); *G01R 1/18* (2013.01); *G01R 31/2806* (2013.01); *G01R 31/2844* (2013.01); *G01R 33/072* (2013.01)

(58) Field of Classification Search
CPC ............... G01R 31/2812; G01R 31/71; G01R 31/2813; G01R 31/28; G01R 31/2818;
(Continued)

(56) References Cited

U.S. PATENT DOCUMENTS

| 3,806,801 A | 4/1974 | Bove |
| 4,554,506 A | 11/1985 | Faure et al. |

(Continued)

FOREIGN PATENT DOCUMENTS

JP    2016151563 A    8/2016

OTHER PUBLICATIONS

Corfin Industries LLC, Tin Whisker Brochure, URL: https://web.archive.org/web/20150426060834/http://www.corfin.com/brochure/Tin_Whisker_Brochure.pdf, printed Aug. 19, 2022, 4 pages.

(Continued)

*Primary Examiner* — Vinh P Nguyen
(74) *Attorney, Agent, or Firm* — Stosch Sabo

(57) ABSTRACT

An apparatus for tin whisker isolation and detection includes a substrate having a plurality of pads for connecting to an electronic component placed on the substrate, and a shield placed on a surface of the substrate. The shield includes a plurality of cavities aligned over the plurality of pads. A plurality of sensing components each associated with one of the plurality of cavities are configured for sensing an electrically conductive growth from a corresponding pad of the plurality of pads. A plurality of circuit connections are each configured to connect one of the sensing components to detection circuitry. The detection circuitry is configured to receive one or more sensing signals from one or more of the sensing components and detect an electrically conductive growth from the corresponding pad based on the one or more sensing signals.

20 Claims, 15 Drawing Sheets

(58) Field of Classification Search
CPC .... G01R 31/2806; G01R 31/70; G01R 31/68;
G01R 1/04; G01R 1/0408; G01R 31/66;
G01R 31/67; G01R 33/072; G01R 31/52;
H05K 1/0268; H05K 3/303; H05K
3/3421; H05K 2201/0769; H05K
2201/10371; H05K 2201/10689; H05K
2203/163; H05K 1/111; H05K 2203/162;
H05K 3/3447; H05K 3/4038; H05K
1/0213; G01D 21/00; G06F 2119/04;
G06F 30/398
See application file for complete search history.

(56) References Cited

U.S. PATENT DOCUMENTS

| | | | |
|---|---|---|---|
| 5,225,777 A | 7/1993 | Bross et al. | |
| 5,909,124 A | 6/1999 | Madine et al. | |
| 6,191,597 B1 | 2/2001 | Driller et al. | |
| 6,225,817 B1 | 5/2001 | Sayre et al. | |
| 6,885,205 B2 | 4/2005 | Siew et al. | |
| 7,262,603 B1* | 8/2007 | Benton | G01R 31/2812 324/528 |
| 7,391,116 B2 | 6/2008 | Chen et al. | |
| 7,461,771 B2 | 12/2008 | Leon | |
| 7,839,150 B2 | 11/2010 | Su et al. | |
| 8,055,594 B2* | 11/2011 | Dhanekula | G01R 31/2846 977/852 |
| 8,329,248 B2* | 12/2012 | Jackson | C23C 28/00 427/97.1 |
| 8,866,080 B2 | 10/2014 | Bower et al. | |
| 8,907,225 B1 | 12/2014 | Deshpande et al. | |
| 9,233,521 B2* | 1/2016 | Chu | C22C 45/10 |
| 9,295,165 B2 | 3/2016 | Landman et al. | |
| 9,948,035 B2* | 4/2018 | Toyama | H05K 1/181 |
| 11,619,665 B2* | 4/2023 | Judd | H05K 3/303 324/512 |
| 11,819,665 B2* | 11/2023 | Okihara | A61M 5/3202 |
| 2005/0106408 A1 | 5/2005 | Chen et al. | |
| 2007/0018663 A1 | 1/2007 | Leinbach et al. | |
| 2007/0187842 A1 | 8/2007 | Shin et al. | |
| 2009/0017327 A1 | 1/2009 | Chen et al. | |
| 2009/0125467 A1 | 5/2009 | Dhanekula et al. | |
| 2012/0195016 A1 | 8/2012 | Landman et al. | |
| 2014/0342113 A1 | 11/2014 | Deshpande et al. | |
| 2016/0151563 A1 | 6/2016 | Yavorsky et al. | |
| 2017/0317451 A1 | 11/2017 | Toyama | |
| 2021/0208190 A1 | 7/2021 | Judd et al. | |

OTHER PUBLICATIONS

NASA, Whisker Failures, URL: https://nepp.nasa.gov/whisker/failures/, retrieved Jul. 25, 2022, 5 pages.

P202103188US01, Appendix P; List of IBM Patent or Applications Treated as Related, Dec. 29, 2022, 2 pages.

Prepared by Rollins et al., Final Report on the Transformational Manufacturing Technology Initiative (TMTI) ManTech Research Project S1057L Tim Whisker Mitigation, The Use of Robotic Solder Dipping to Replace Electronic Part Surfaces Finishes of Pure Tin With a Tin-Lead Finish, URL: https://docplayer.net/49780084-Draft-final-report-on-the-transformational-manufacturing-technology-initiative-tmti-mantech-research-project-s1057-tin-whisker-mitigation.html, Apr. 12, 2006, 53 pages.

Zhou et al., Whisker inhibited Sn—Bi alloy coating on copper surface to increase copper bonding strength for signal oss reduction of PCB in high-frequency, ScienceDirect, ELSEVIER, Applied Surface Science, vol. 513, 30, dated May 30, 2020, 8 pages.

International Search Report and Written Opinion, PCT/IB2023/061425, dated Feb. 21, 2024, 14 pages.

* cited by examiner

```
┌─────────────────────────────────────────────────────────────┐
│ Place A Shield On A Surface Of A Substrate Having An       │
│ Electronic Component Placed Thereon And A Plurality Of Pads│
│ For Connecting To The Electronic Component, The Shield     │
│ Having A Plurality Of Cavities Aligned Over The Plurality  │
│ Of Pads                                                     │
│ 1502                                                        │
└─────────────────────────────────────────────────────────────┘
                              │
                              ▼
┌─────────────────────────────────────────────────────────────┐
│ Sense An Electrically Conductive Growth From A Corresponding│
│ Pad Of The Plurality Of Pads Using A Sensing Component     │
│ Associated With One Of The Plurality Of Cavities, Each Of  │
│ The Sensing Components Associated With One Of A Plurality  │
│ Of Cavities                                                 │
│ 1504                                                        │
└─────────────────────────────────────────────────────────────┘
                              │
                              ▼
┌─────────────────────────────────────────────────────────────┐
│ Receive, By Detection Circuitry, One Or More One Or More   │
│ Sensing Signals From One Or More Of The Sensing Components │
│ 1506                                                        │
└─────────────────────────────────────────────────────────────┘
                              │
                              ▼
┌─────────────────────────────────────────────────────────────┐
│ Detect, By The Detection Circuitry, An Electrically        │
│ Conductive Growth From The Corresponding Pad Based On The  │
│ One Or More Sensing Signals                                 │
│ 1508                                                        │
└─────────────────────────────────────────────────────────────┘
                              │
                              ▼
┌─ ─ ─ ─ ─ ─ ─ ─ ─ ─ ─ ─ ─ ─ ─ ─ ─ ─ ─ ─ ─ ─ ─ ─ ─ ─ ─ ─ ─ ─┐
│ Identify, By The Detection Circuitry, The Pad Having The   │
│ Electrically Conductive Growth Based On The One Or More    │
│ Sensing Signals                                             │
│ 1510                                                        │
└─ ─ ─ ─ ─ ─ ─ ─ ─ ─ ─ ─ ─ ─ ─ ─ ─ ─ ─ ─ ─ ─ ─ ─ ─ ─ ─ ─ ─ ─┘
```

FIG. 15

APPARATUS AND METHOD FOR TIN WHISKER ISOLATION AND DETECTION

BACKGROUND

Field of the Invention

The field of the invention is related to electrical apparatus having tinned or soldered connections, or, more specifically, methods and apparatus for tin whisker isolation and detection.

Description of Related Art

Whisker growth has been highlighted as a significant hazard and an unknown for high reliability electronic product operation. Tin whiskers are metallic and crystalline filamentary structures that grow outwardly from metal surfaces and are more commonly found in electrodeposited tin (Sn) coating and tin-based alloys. Whiskers can take many forms including filaments, straight, kinked, spiral, nodules, and odd-shaped eruptions. Typically, whiskers are between 1 nanometer 500 nanometers in length, and 0.5 microns to 50 microns in thickness. Leab (Pb)-free solder joints have result in the growth of tin whiskers between components and signals on printed wiring boards (PWBs), thus leading to the formation of unintended conductive paths. In turn, this presents catastrophic safety and reliability threats in computer systems.

Significant research has been conducted by the United States government, avionics, and military groups to better understand the cause of whisker growth as well as methods to control or stop this growth. According to National Aeronautical and Space Administration (NASA) studies, many failures have been attributed to tin whisker growth. To date, the mechanism of tin whisker growth is still not fully understood. Efforts to mitigate whisker growth is on-going and is one reason why tin/lead (SnPb) alloys are still permitted for use in a wide variety of mission-critical applications such as space, avionics, missiles, and defense applications. A variety of mitigation techniques exist including alloying purge plating, hot dip reflowing to pretreat pins, post-solder reheating/reflowing, and use of a nickel barrier between tin (Sn) and copper (Cu) surfaces. Some of these existing mitigation techniques are useful for mission critical systems, but are quite expensive for universal applications because they require significant resource usage such as capital expenditure, training, maintenance/repairs, materials, floor space, electricity, dedicated operators/personnel, and time.

SUMMARY

In an embodiment, an apparatus for tin whisker isolation and detection includes a substrate having a plurality of pads for connecting to an electronic component placed on the substrate, and a shield placed on a surface of the substrate, the shield having a plurality of cavities aligned over the plurality of pads. The apparatus further includes a plurality of sensing components, each of the sensing components associated with one of the plurality of cavities and configured for sensing an electrically conductive growth from a corresponding pad of the plurality of pads. The apparatus further includes a plurality of circuit connections, each of the plurality of circuit connections configured to connect one of the sensing components to detection circuitry. The detection circuitry is configured to receive one or more sensing signals from one or more of the sensing components and detect an electrically conductive growth from the corresponding pad based on the one or more sensing signals.

In an embodiment, the detection circuitry is configured to identify the pad having the electrically conductive growth based on the one or more sensing signals. In an embodiment, the apparatus further includes a plurality of contacts, each of the plurality of contacts being coupled to an output of a corresponding one of the plurality of sensing components. In an embodiment, each of the plurality of contacts is further coupled to the detection circuitry.

In an embodiment, one or more of the plurality of sensing components includes an operational amplifier. In another embodiment, the plurality of sensing components are contained within the shield. In another embodiment, the plurality of sensing components are placed on a another substrate, the another surface mounted to an outer surface of the shield.

In an embodiment, each of the plurality of sensing components includes a hall-effect sensor configured to sense a change in a magnetic field generated by a magnet within the cavity and generate the sensing signal based upon the change in the magnetic field. In an embodiment, the detection circuitry further includes a selection matrix coupled to each of the plurality of sensing components, the selection matrix being configured to select one of the sensing signals and detect the electrically conductive growth from the corresponding pad based on the selected sensing signal.

In an embodiment, the detection circuitry is configured to output a status bit indicative of a location of the detected electrically conductive growth. In another embodiment, the detection circuitry is configured to detect the electrically conductive growth using time domain reflectometry. In another embodiment, the detection circuit is configured to detect the electrically conductive growth using vector network analysis. In an embodiment, the shield is formed of a metalized ceramic substrate.

An embodiment of a method of detecting a tin whisker in an apparatus having an electronic component placed on a substrate having a plurality of pads for connecting to the electronic component includes placing a shield on a surface of the substrate, the shield having a plurality of cavities aligned over the plurality of pads. The method further includes sensing an electrically conductive growth from a corresponding pad of the plurality of pads using a sensing component associated with one of the plurality of cavities, each of the sensing components associated with one of a plurality of cavities. The method further includes receiving, by detection circuitry, one or more sensing signals from one or more of the sensing components. The method further includes detecting, by the detection circuitry, an electrically conductive growth from the corresponding pad based on the one or more sensing signals.

In an embodiment, the method further includes identifying, by the detection circuitry, the pad having the electrically conductive growth based on the one or more sensing signals.

In an embodiment, detecting the electrically conductive growth from the corresponding pad further includes sensing a change in a magnetic field generated by a magnet within the cavity and generating the sensing signal based upon the change in the magnetic field.

In an embodiment, the method further includes selecting one of the sensing signals and detecting the electrically conductive growth from the corresponding pad based on the selected sensing signal. In an embodiment, the method further includes outputting a status bit indicative of a location of the detected electrically conductive growth.

In an embodiment, detecting the electrically conductive growth further includes detecting the electrically conductive growth using time domain reflectometry. In another embodiment, detecting the electrically conductive growth further comprises detecting the electrically conductive growth using vector network analysis.

The foregoing and other objects, features and advantages of the invention will be apparent from the following more particular descriptions of exemplary embodiments of the invention as illustrated in the accompanying drawings wherein like reference numbers generally represent like parts of exemplary embodiments of the invention.

BRIEF DESCRIPTION OF THE DRAWINGS

FIG. 15 sets forth a flow chart illustrating an exemplary method for in whisker isolation and detection according to exemplary embodiments.

DETAILED DESCRIPTION

The exemplary embodiments disclose an apparatus and method for tin whisker isolation and detection which mitigate the damage to electrical components due to tin whisker growth. In particular embodiments, an electrical component that is soldered to a substrate has a shield having cavities covering corresponding pads of the electrical component to act as a shield or barrier to limit tin whisker growth and prevent the tin whiskers from physically contacting adjacent tinned or soldered connections. Particular embodiments further provide for detection of a whisker growth event at a particular pad or lead of the electrical component and identification of the particular lead or pad of the electrical component associated with the whisker growth event.

Figure 1:
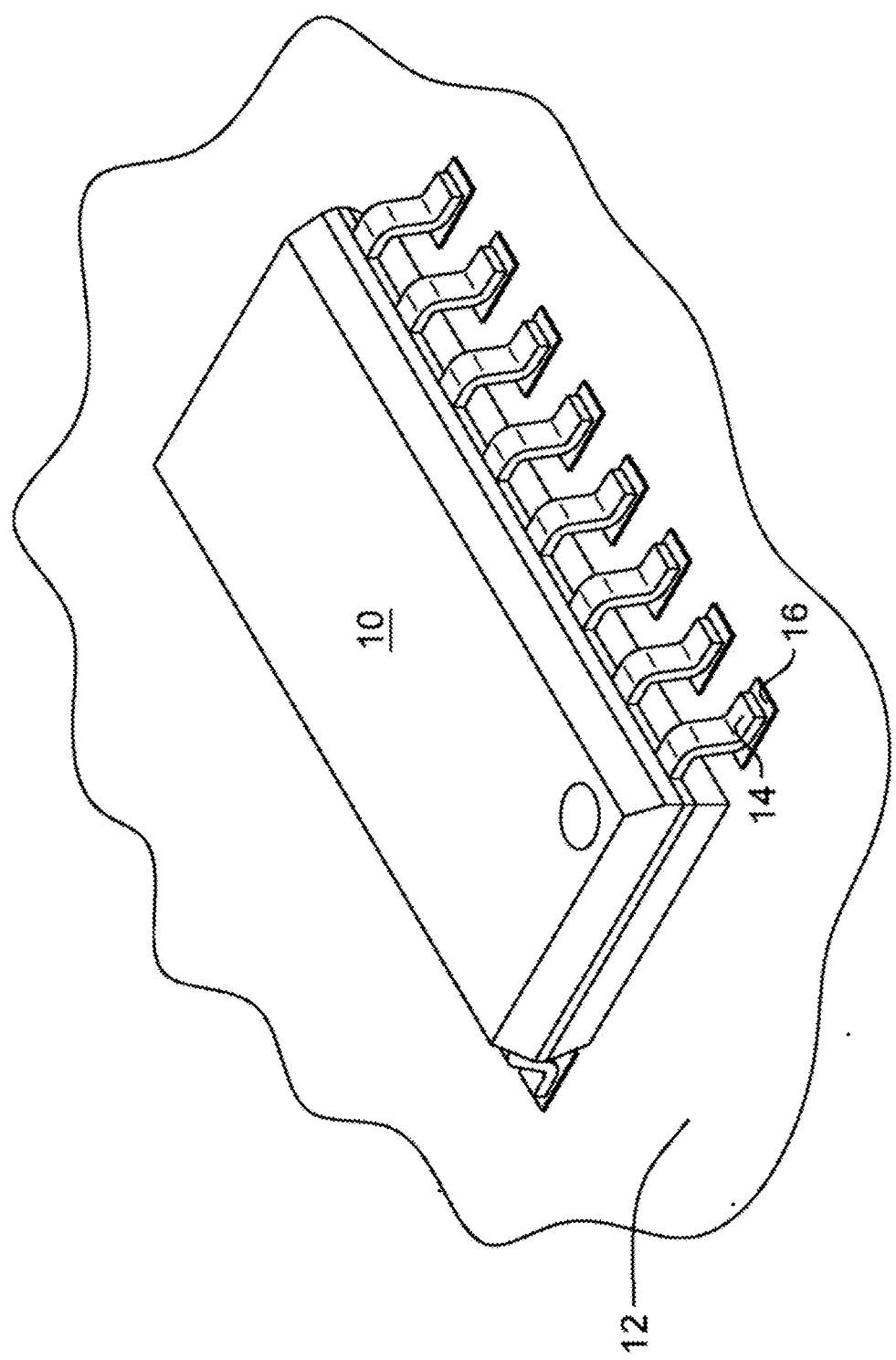
FIG. 1 illustrates a perspective view of a surface mount component mounted on substrate.

Exemplary methods, apparatus, and products for tin whisker isolation and detection in accordance with the present invention are described with reference to the accompanying drawings, beginning with FIG. 1. FIG. 1 illustrates a perspective view of a surface mount component 10 mounted on substrate 12. In a particular embodiment, the substrate 12 includes a printed circuit board. The particular surface mount component 10 shown is a Thin Small Outline Package (TSOP) which includes a semiconductor device mounted on a carrier but the exemplary embodiments have wide applicability to other surface mount components such as, but not limited to, Dual In-line package (DIP), Quad Flat Pack package (QFP), Small Outline Package (SOP) and JEDEC package styles. The surface mount component 10 incudes leads 14 which are joined to pads 16 on the surface of the substrate 12 by solder (not shown in FIG. 1). The leads 14 may be copper, for example, and coated with tin for easy solderability to the pads 16. If a tin whisker were to grow from the solder (not shown) or the leads 14 and contact an adjacent lead 14, pad 16 or solder, a short or arc may occur, likely damaging the surface mount component 10.

Figure 2:
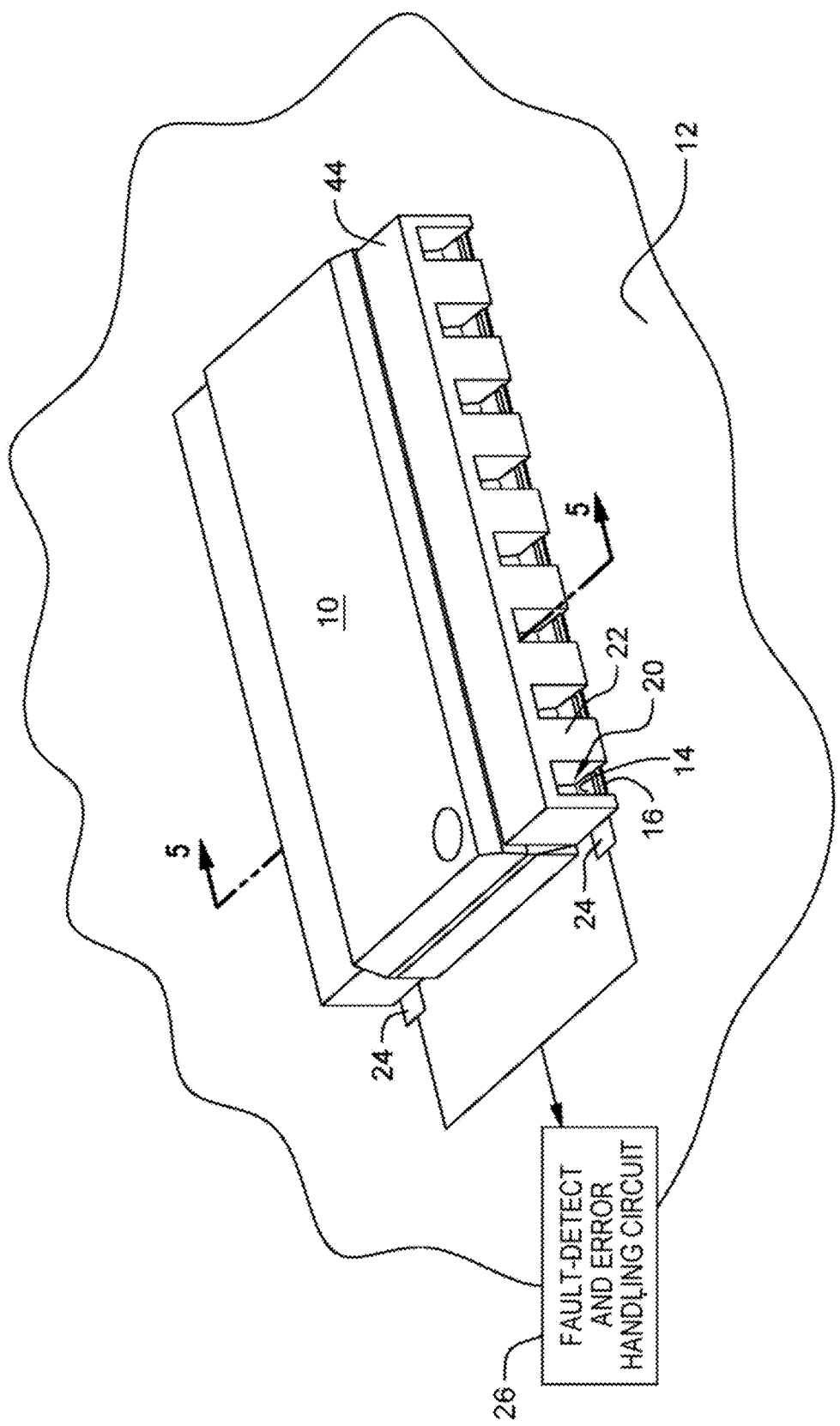
FIG. 2 illustrates an embodiment of a shield placed over leads of surface mount component of FIG. 1.

Referring now to FIG. 2, FIG. 2 illustrates an embodiment of a shield 44 placed over leads 14 of surface mount component 10 of FIG. 1. In particular, FIG. 2 illustrates an embodiment of a shield 44 as described in U.S. Patent Application Publication No. 2021/0208190 incorporated herein by reference. The shield 44 has openings (or cavities) 20 through which the leads 14 from the surface mount component 10 and pads 16 on the surface of the printed circuit board 12 are visible. The shield 44 with the openings 20 form a "carport-like" structure. In particular embodiments, the leads 14 and pads 16 do not protrude from the shield 18. Each of the openings 20 include walls 22 forming a barrier between adjacent leads 14, solder (not shown) and pads 16 so if a tin whisker were to form, the adjacent leads 14, solder, and pads 16 would not be contacted, thereby avoiding the possibilities of shorts and arcs.

In a particular embodiment, the shield 44 is made from a metallic material such as copper or aluminum for example. An exemplary operation is to sense when a tin whisker has made contact with a wall 22 of the shield 44. When the shield 44 is fabricated from a metallic material, the entire shield 44 is conductive and through contact 24, outputs an indication to a Fault-Detect and Error Handling Circuit 26 when a tin whisker contacts the shield 44.

In another embodiment, the shield 44 is made from a nonmetallic material such as an epoxy. In some embodiments, to indicate the presence of a tin whisker, the walls 22 of the openings 20 are made to be conductive such as by a metallic coating on the walls 22, and the outer surface of the shield 44 is also made to be conductive by coating with a metallic material. In particular embodiments, the metallic coating for the walls 22 and outer surface of the shield 44 may be, for example, copper. Any tin whisker contact with the walls 22 may be conducted to the metallic outer surface of the shield 44 and then to contact 24 to output an indication to the Fault-Detect and Error Handling Circuit 26 when a tin whisker contacts the shield 44.

Figure 3:
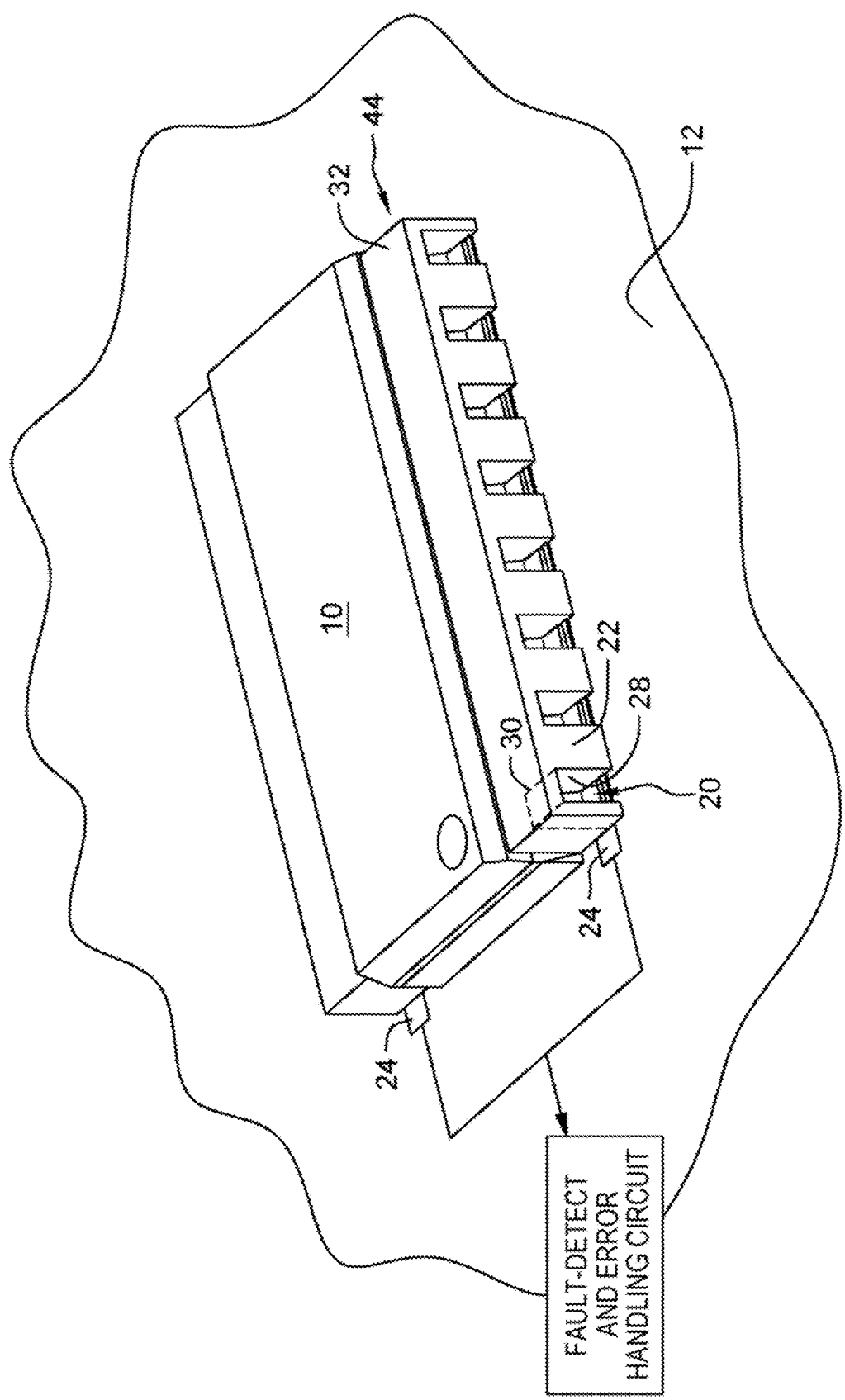
FIG. 3 illustrates an embodiment in which the shield placed over the leads of the surface mount component of FIG. 1 is nonconductive but has a metallic coating and the interior surface of the walls of the shield also has a metallic coating.

FIG. 3 illustrates an embodiment in which the shield 44 is nonconductive but has a metallic coating 32 and the interior surface 28 of the walls 22 also has a metallic coating and the interior surface of the walls of the shield 44 also has a metallic coating as described in U.S. Patent Application Publication No. 2021/0208190. In an embodiment, the shield 44 may have internal wiring 30 such that when a tin whisker contacts interior surface 28 of the walls 22, the contact is conducted through wiring 30 to metallic coating 32 and then to contact 24 for outputting to the Fault-Detect and Error Handling Circuit 26. It should be understood that while internal wiring 30 is shown from only one opening 20, in some embodiments internal wiring 30 between each opening 20 and the contact 24 is used so as to be able to detect tin whiskers in any of the openings 20.

The embodiments described in U.S. Patent Application Publication No. 2021/0208190 provide for a physical barrier to impede/contain tin (Sn) whisker growth by using a "car-port"-like structure that acts as a physical barrier to prevent tin whisker dendritic growth. If a tin whisker grows unknowingly from a component I/O lead, it is preventing from shorting/arcing to a nearby lead within the same device, an adjacent device, or any other conductive feature on a printed circuit board assembly (PCBA) or other substrate.

Various embodiments described herein provide for an enhanced whisker growth barrier that cannot be penetrated by a tin whisker, and enhanced whisker sensing in which a whisker event, such as a momentary short-circuit, is identified. In particular embodiments, if a whisker grows long enough to come into contact with the barrier, a sensing circuit and associated multiplexing or matrix selection circuitry is configured to pinpoint the location of the whisker using system monitoring and/or characterization analysis modes as further described herein. In particular embodiments, sensing circuits associated with each cavity of the shield are incorporated into the shield or mounted to an external surface of the shield or proximate to the shield (e.g., mounted on an external card). Various embodiments of sensing and detection circuits are described herein including operational amplifier-based sensor circuits, hall-effect sensor circuits, time domain reflectometry (TDR) detection circuits, and vector network analysis (VNA) detector circuits.

Figure 4:
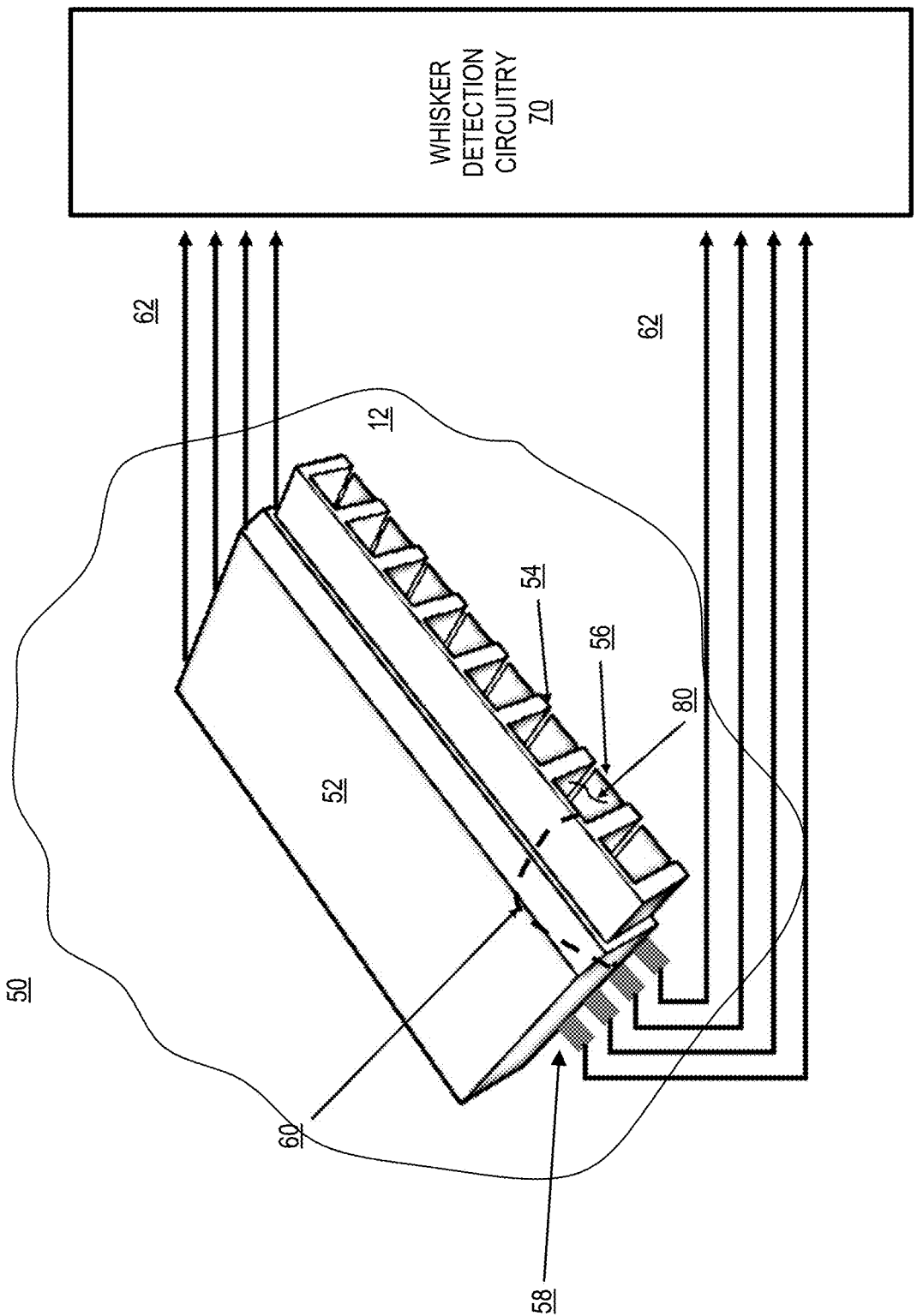
FIG. 4 illustrates an apparatus for tin whisker isolation and detection according to an exemplary embodiment.

FIG. 4 illustrates an apparatus 50 for tin whisker isolation and detection according to an exemplary embodiment. The apparatus 50 includes a shield 52 placed over leads 56 of a surface mount component (not shown) mounted on a substrate 12. The shield 52 includes cavities 54 aligned over the leads 56 of the surface mount component and corresponding pads on the substrate 12 to which the leads 56 are soldered. In the particular embodiment illustrated in FIG. 4, the shield 52 includes eight cavities 54 aligned over each leads/pads of the surface mount component. For illustration purposes, the cavities 54 are shown as being open at one end, however, in one or more implementations each of the cavities 54 includes an additional wall (not shown) fully enclosing the cavity 54.

In the embodiment of FIG. 4, the interior surfaces of each cavity 54 is metallized and internally routed to a case contact 58 on the substrate 12 via a circuit connection 60. For illustration purposes, a single connection of an individual cavity 54 to a corresponding case contact 58 is shown. However, it should be understood that in the embodiment of FIG. 4 each of the cavities 54 is connected by internal routing to a corresponding case contact 58 via a separate surface connection 60. Accordingly, each of the cavities 54 is individually internally routed to a corresponding case contact 58. In the embodiment of FIG. 4, the shield 52 is not electrically coupled to the case contacts 58. In the embodiment illustrated in FIG. 4, four case contacts 58 are located at a first side of the shield 52 and four case contacts (not shown) are located at an opposite side of the shield 52.

Each of the case contacts 58 are connected via circuit connections 62 to whisker detection circuitry 70. The whisker detection circuitry 70 is configured to receive a signal from one or more of the cavities 56 when a tin whisker 80 has formed between the lead/pad and a wall of the cavity 54, for example, causing a short circuit or other fault. The whisker detection circuitry 70 determines that a whisker event caused by the growth of the tin whisker 80 has occurred and identifies the location of the whisker event by identifying the particular cavity 54 associated with the growth of the tin whisker 80. In a particular embodiment, the whisker detection circuitry 70 determines that a short has occurred between the tin whisker 80 and the cavity 54 based on the received signal.

Figure 5:
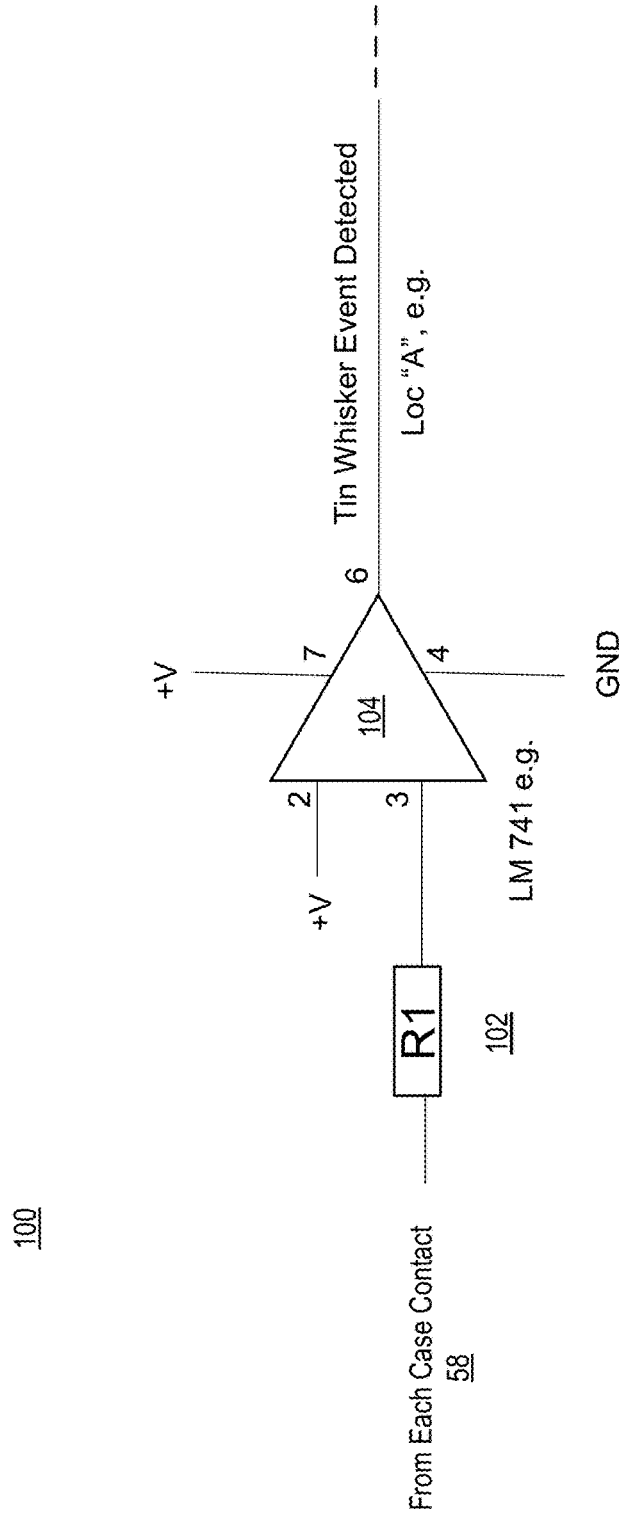
FIG. 5 illustrates a sensor component for sensing whisker growth according to an exemplary embodiment.

FIG. 5 illustrates a sensor component 100 for sensing whisker growth according to an exemplary embodiment. The sensor component 100 includes a resistor 102 having a resistance R1 and an operational amplifier (op-amp) circuit 104. In a particular embodiment, the op-amp circuit 104 includes an LM741 op-amp. A first terminal of the resistor 102 is connecting to a single case contact (e.g., one of the case contacts 58 of FIG. 4) of a shield placed over leads of a surface mount component. A second terminal of the resistor 102 is connected to a non-inverting (+) input (3) of the op-amp circuit 104. An inverting (−) input (2) and a positive power (V+) input (7) of the op-amp circuit 104 are both connected to a positive supply voltage (+V). A negative power (V−) input of the op-amp circuit 104 is connected to a ground (GND). An output terminal (6) of the op-amp circuit 104 is coupled to a whisker detection circuitry 106 including a multiplexing/selection matrix as further described herein. Although a single sensor component 100 is shown in FIG. 5, it should be understood that in various embodiments each of the case contacts 58 of shield is connected to a separate sensor component 100, and the outputs of each of the sensor components 100 are connected to the whisker detection circuit 106. In a particular embodiment, the sensor component 100 for each of the case contacts 58 is included in the shield. In another particular embodiment, sensor component 100 for each of the case contacts 58 is included on a separate card/board mounted to or nearby the shield.

During operation of the sensor component 100, the sensor component 100 functions as a current sensor to sense a signal having a current equal to or greater than a predetermined threshold current received from a corresponding case contact 58. The resistance value R1 of the resistor 102 is determined by dividing the supply voltage by the desired current threshold. In a particular embodiment, the sensor component 100 is configured with a supply voltage of 10 volts (V) to detect a current threshold of 1 milliamp (mA). Accordingly, a resistance R1 to be used for the resistor 102 is calculated to be (10V/0.001 A) equal to 10 kilo ohms. If a whisker growth occurs between a lead/pad and a cavity 54 corresponding to a location "A", a current is generated and provided to the associated case contact 58. The current is received by the op-amp circuit 104 via the resistor 102. If the current equals or exceeds the configured current threshold, the op-amp circuit 104 outputs an indication of a detected tin whisker event to the whisker detection circuitry 106. Since the association between the location "A" and corresponding sensor component 100 is known, the occurrence of the tin whisker event as well as the associated location is determined by the whisker detection circuitry 106.

Figure 6:
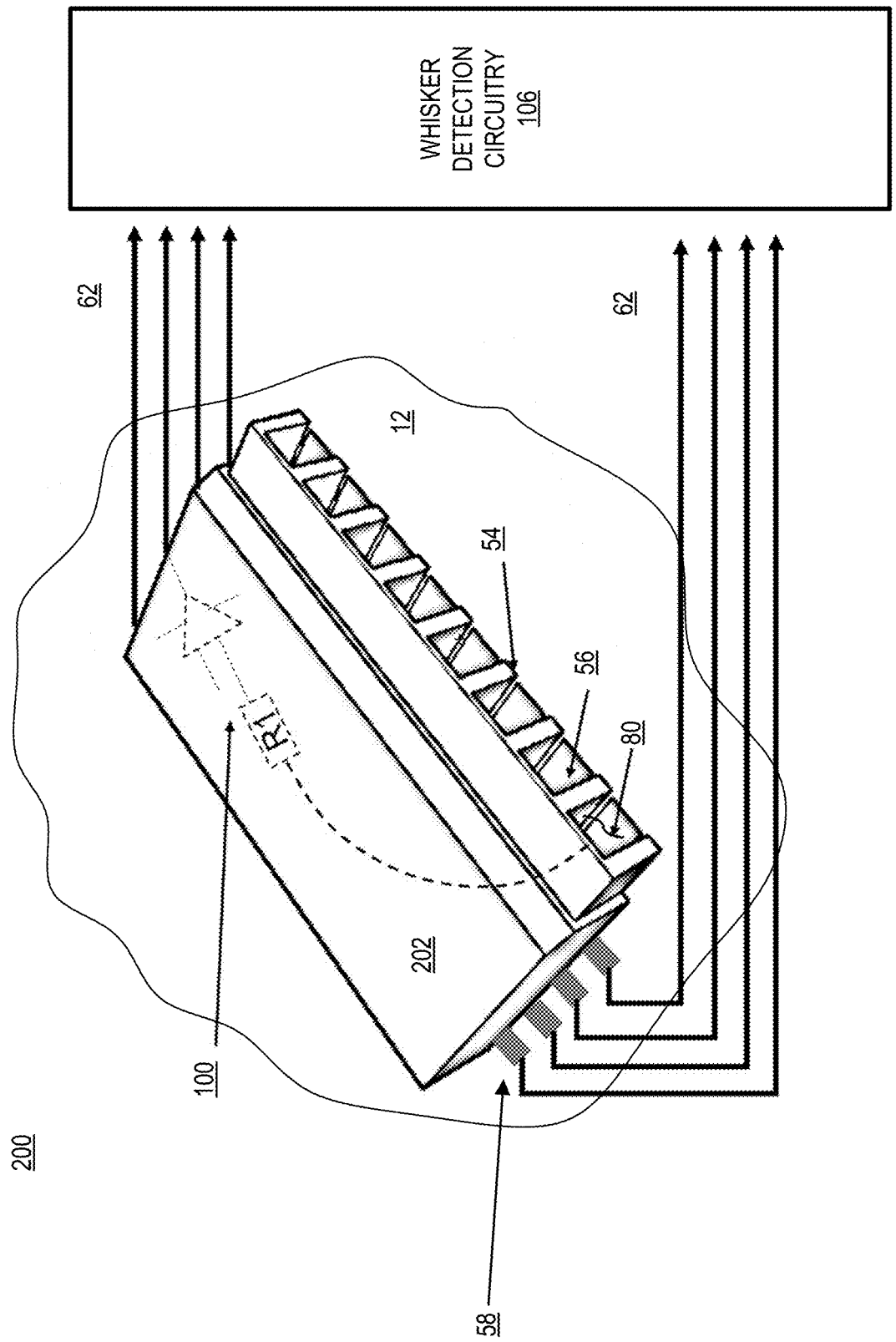
FIG. 6 illustrates an apparatus for tin whisker isolation and detection according to another exemplary embodiment.

FIG. 6 illustrates an apparatus 200 for tin whisker isolation and detection according to another exemplary embodiment. The apparatus 200 includes a shield 202 placed over leads 56 of a surface mount component (not shown) mounted on a substrate 12. The shield 202 includes cavities 54 aligned over the leads 56 of the surface mount component and corresponding pads on the substrate 12 to which the leads 56 are soldered. In the particular embodiment illustrated in FIG. 6, the shield 202 includes eight cavities 54 aligned over each leads/pads of the surface mount component. For illustration purposes, the cavities 54 are shown as being open at one end, however, in one or more implementations each of the cavities 54 includes an additional wall (not shown) fully enclosing the cavity 54. In a particular embodiment, the shield 202 is formed of a metalized ceramic substrate.

In the embodiment of FIG. 6, the interior surfaces of each cavity 54 is connected to an input of a sensor component 100 described with respect to FIG. 5, and an output of the sensor component 100 is connected to a corresponding case contact 58 on the substrate 12. For illustration purposes, a single sensor component 100 connected between an individual cavity 54 and a corresponding case contact 58 is shown. However, it should be understood that in the embodiment of FIG. 5 each of the cavities 54 is connected to a corresponding case contact 58 via a separate sensor component 100. Accordingly, each of the cavities 54 is individually connected to a corresponding case contact 58 via a sensor component 100. In a particular embodiment, each of the sensor components 100 are formed of thin film deposited circuits. In the embodiment of FIG. 6, the shield 202 is not electrically coupled to the case contacts 58. In the embodiment illustrated in FIG. 6, four case contacts 58 are located at a first side of the shield 202 and four case contacts (not shown) are located at an opposite side of the shield 202.

Each of the case contacts 58 is connected via circuit connections 62 to the whisker detection circuitry 106. The whisker detection circuitry 106 is configured to receive a signal from one or more of the sensor components 100 when a tin whisker 80 has formed between the lead/pad and a wall of the cavity 54, for example, causing a short circuit or other fault. The whisker detection circuitry 106 determines that a whisker event caused by the growth of the whisker 80 has occurred and identifies the location of the whisker event by identifying the particular cavity 54 that has caused the whisker event.

Figure 7:
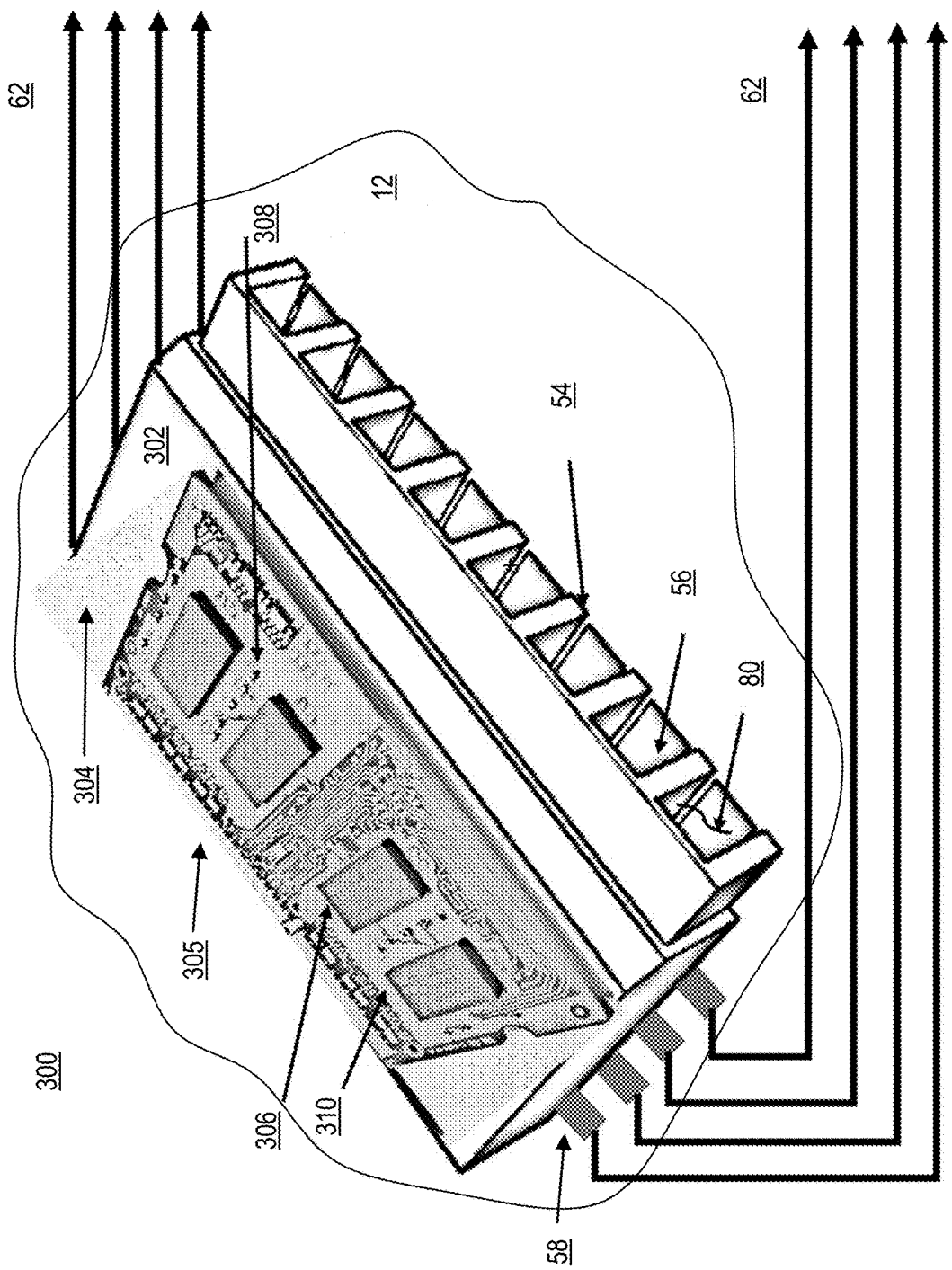
FIG. 7 illustrates an apparatus for tin whisker isolation and detection according to another exemplary embodiment.

FIG. 7 illustrates an apparatus 300 for tin whisker isolation and detection according to another exemplary embodiment. The apparatus 300 includes a shield 302 placed over leads 56 of a surface mount component (not shown) mounted on a substrate 12. The shield 302 includes cavities 54 aligned over the leads 56 of the surface mount component and corresponding pads on the substrate 12 to which the leads 56 are soldered. In the particular embodiment illustrated in FIG. 7, the shield 302 includes eight cavities 54 aligned over each leads/pads of the surface mount component. For illustration purposes, the cavities 54 are shown as being open at one end, however, in one or more implementations each of the cavities 54 includes an additional wall (not shown) fully enclosing the cavity 54.

The apparatus 300 of FIG. 7 is similar to the apparatus 200 of FIG. 6 except that sensor components 305 are included on a second substrate 304 mounted on an outer surface of the shield 302 instead of within the shield 302 as discussed with respect to FIG. 6. In the particular embodiment illustrated in FIG. 7, the second substrate 304 includes op-amp circuits 306, resistors 308, and selector circuits 310. In a particular embodiment, the second substrate 304 is included on a secondary card/board. In the embodiment of FIG. 7, the interior surfaces of each cavity 54 is connected to an input of a sensor component 305, and an output of the sensor component 305 is connected to a corresponding case contact 58 on the substrate 12. Accordingly, each of the cavities 54 is individually connected to a corresponding case contact 58 via a sensor component 305. In the embodiment of FIG. 7, the shield 302 is not electrically coupled to the case contacts 58. In the embodiment illustrated in FIG. 7, four case contacts 58 are located at a first side of the shield 302 and four case contacts (not shown) are located at an opposite side of the shield 302.

Each of the case contacts 58 is connected via circuit connections 62 to the whisker detection circuitry 106. The whisker detection circuitry 106 is configured to receive a signal from one or more of the sensor components 100 when a tin whisker 80 has formed between the lead/pad and a wall of the cavity 54, for example, causing a short circuit or other fault. The whisker detection circuitry 106 determines that a whisker event caused by the growth of the tin whisker 80 has occurred and identifies the location of the whisker event by identifying the particular cavity 54 that has caused the whisker event.

Figure 8:
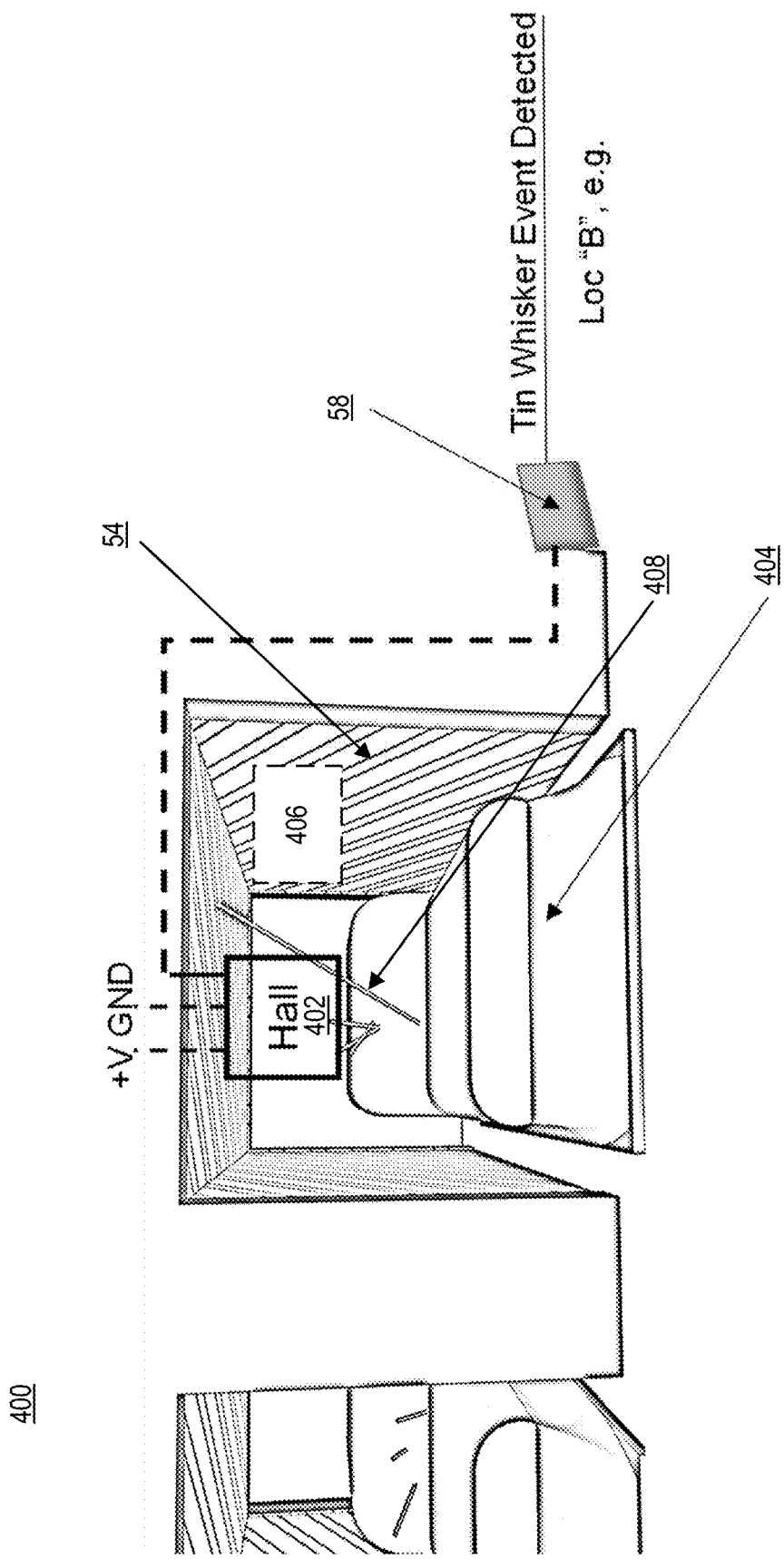
FIG. 8 illustrates a sensor component for sensing whisker growth according to another exemplary embodiment.

FIG. 8 illustrates a sensor component 400 for sensing whisker growth according to another exemplary embodiment. The sensor component 400 includes a hall-effect sensor 402 mounted within the cavity 54 of the shield 202 of FIG. 6 instead of the sensor component 400. The cavity 54 covers a lead/pad 404 of a surface mount component. The sensor component further includes one or more magnets 406 mounted within the cavity 54. In a particular embodiment, the one or more magnets are mounted to one or more walls of the cavity 54 such as a "garage door" (not shown) enclosing the cavity 54. A power terminal of the hall-effect sensor 402 is connected to a supply voltage (+V) and a ground terminal of the hall-effect sensor 402 is connected to a ground (GND). An output terminal of the hall-effect sensor 402 is connected to a case contact 58.

The one or more magnets 406 cause a magnetic field to be established within the cavity 54. The occurrence of a whisker growth 408 from the lead/pad 404 within the cavity 54 corresponding to a location "B", causes a disturbance in the magnetic field within the cavity 54. The hall-effect sensor 402 generates a signal in response to detecting the magnetic field disturbance and sends the signal to the case contact 58. The signal is received by a multiplexing/selection matrix of whisker detection circuitry as an indication of a detected tin whisker event. Since the association between the location "B" and corresponding hall-effect sensor 402 is known, the occurrence of the tin whisker event as well as the associated location is determined by the whisker detection circuitry. In order to detect the tin whisker event, the whisker growth 408 need not contact a wall of the cavity 54. Instead, a tin whisker event may be detected before the whisker growth 408 reaches a wall of the cavity 54. Accordingly, a tin whisker event may be detected earlier than in embodiments in which contact of a whisker growth with a cavity wall triggers detection of a tin whisker event. In some embodiments, a baseline magnetic field within each cavity 54 is measured prior to any whisker growth. The detection of a whisker event is determined by measuring deviations from the baseline magnetic field that exceed a predetermined threshold. In other embodiments, the baseline magnetic field may be periodically determined.

Figure 9:
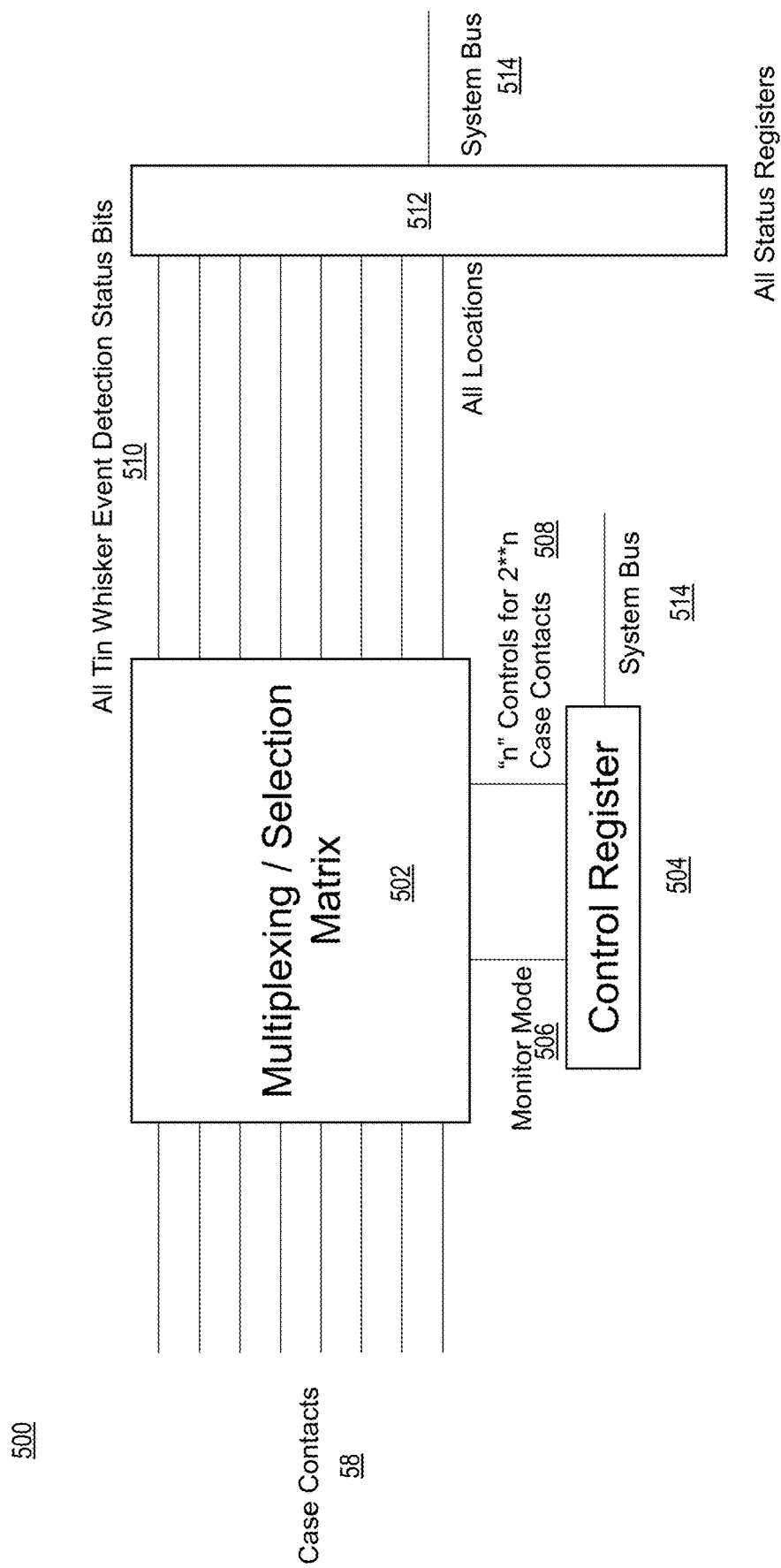
FIG. 9 illustrates detection circuitry for whisker detection and isolation according to an exemplary embodiment.

FIG. 9 illustrates detection circuitry 500 for whisker detection and isolation according to an exemplary embodiment. The detection circuitry 500 includes a multiplexing/selection matrix 502 and a control register 504. Inputs of the multiplexing/selection matrix 502 are connected to the case contacts 58 of a shield (e.g., shield 52 of FIG. 4, shield 202 of FIG. 6, or shield 302 of FIG. 7) to receive signals indicative of a tin whisker event associated with a corresponding cavity 54. The control register 504 is connected to the multiplexing/selection matrix 502 and a system bus 514 and is configured to set a monitor mode 506 of the multiplexing/selection matrix 502. Outputs 510 of the multiplexing/selection matrix 502 are provide to status registers 512. The status registers 512 include status bits associated with each case contact channel to indicate whether the particular channel has triggered a tin whisker event. The status bits are provided to the system bus 514.

The control register 504 is further configured to control 508 which of the inputs from the case contacts 58 are enabled for passthrough of the multiplexing/selection matrix 502 at a particular time. In particular, the control register 504 is configured to use n controls to control inputs for $2^n$ case contact channels. If the monitor mode is set a normal mode of operation, all case contact channels pass through the multiplexing/selection matrix 502 to allow monitoring/detecting that a disturbance due to a whisker event has occurred on one of the case contacts 58. If the monitor mode is set to a characterization/failure analysis mode, an individual case contact channel is selected to allow further or more detailed study of a given shield cavity associated with the case contact channel. In an embodiment, one or more of the case contact channels are provided to a machine learning model configured to predict if a particular shield cavity is prone to tin whisker growth.

Figure 10:
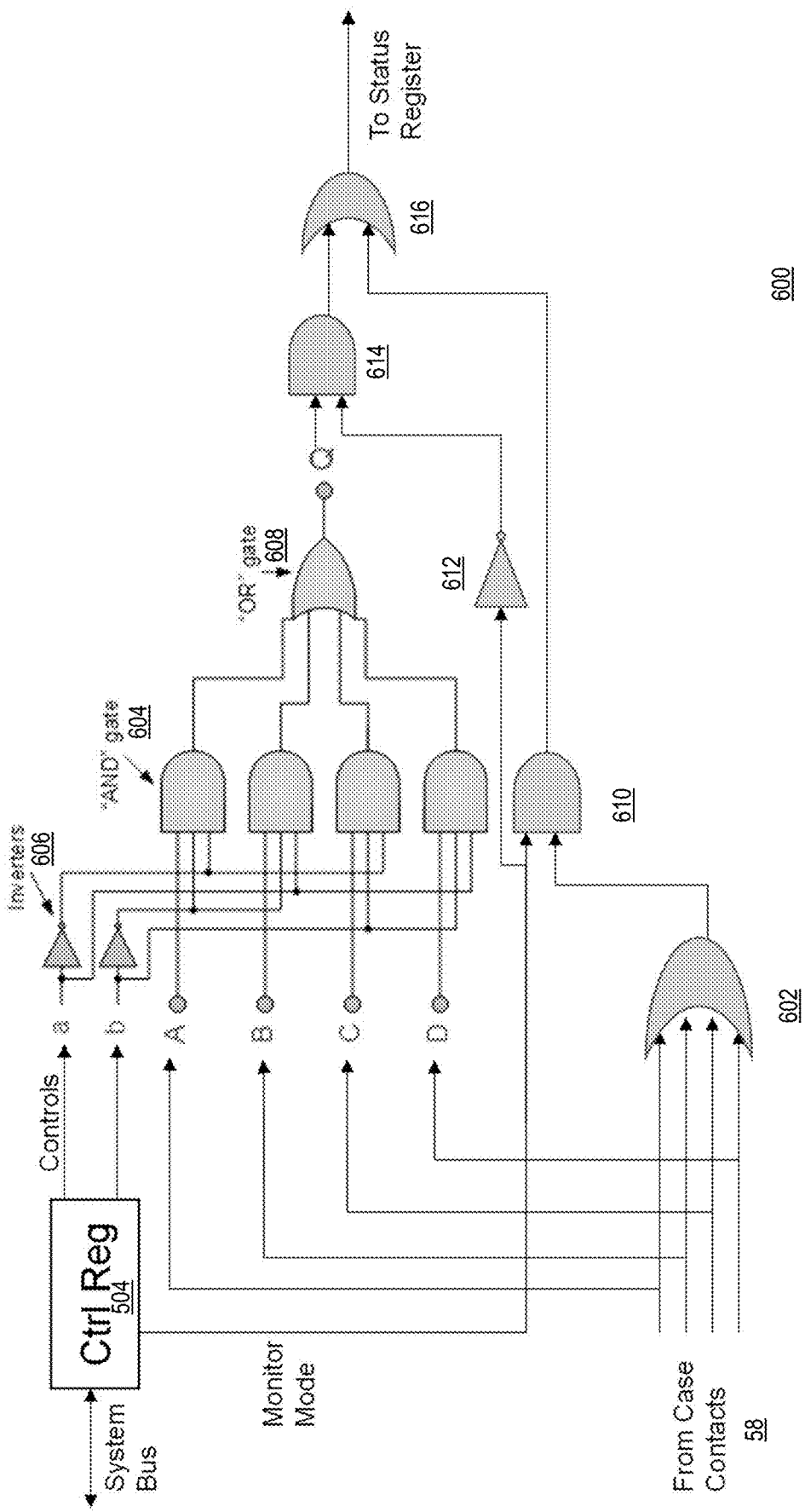
FIG. 10 illustrates multiplexing/selection matrix circuitry of the detection circuitry of FIG. 9 according to an exemplary embodiment.

FIG. 10 illustrates multiplexing/selection matrix circuitry 600 of the detection circuitry 500 of FIG. 9 according to an exemplary embodiment. In the embodiment of FIG. 10, two controls (a, b) and four case contacts 58 (A, B, C, D) are shown. Other embodiments may include any number of case contacts and corresponding controls. The multiplexing/selection matrix circuitry 600 includes a first OR gate 602 having inputs connected to the four case contacts 58. Each case contact 58 is further connected to a first input of one of first AND gates 604. A control register 504 provides the two controls (a, b) to corresponding first inverters 606 and an inverter output from each of the first inventers 606 are provided to a second input of two of the first AND gate 604. A non-inverted version of each of the control signal (a,b) are provided to a third input of two of the first AND gates 604. Outputs of each of the first AND gates 604 are provided to a second OR gate 608. A monitor mode control signal from the control register 504 is provided to a first input of a second AND gate 610 and an input of a second inverter 612 to set whether the multiplexing/selection matrix circuitry 600 is in the normal mode or the characterization/failure analysis mode.

Still referring to FIG. 10, an output of second OR gate 608 is connect to a first input of a third AND gate 614, and an output of the second inverter 612 is provided to a second input of the third AND gate 614. An output of the third AND gate 614 and an output of the second AND gate 614 are provided to a first input and a second input, respectively, of a third OR gate 616. An output of the third OR gate 616 is provided to a status register.

Figure 11:
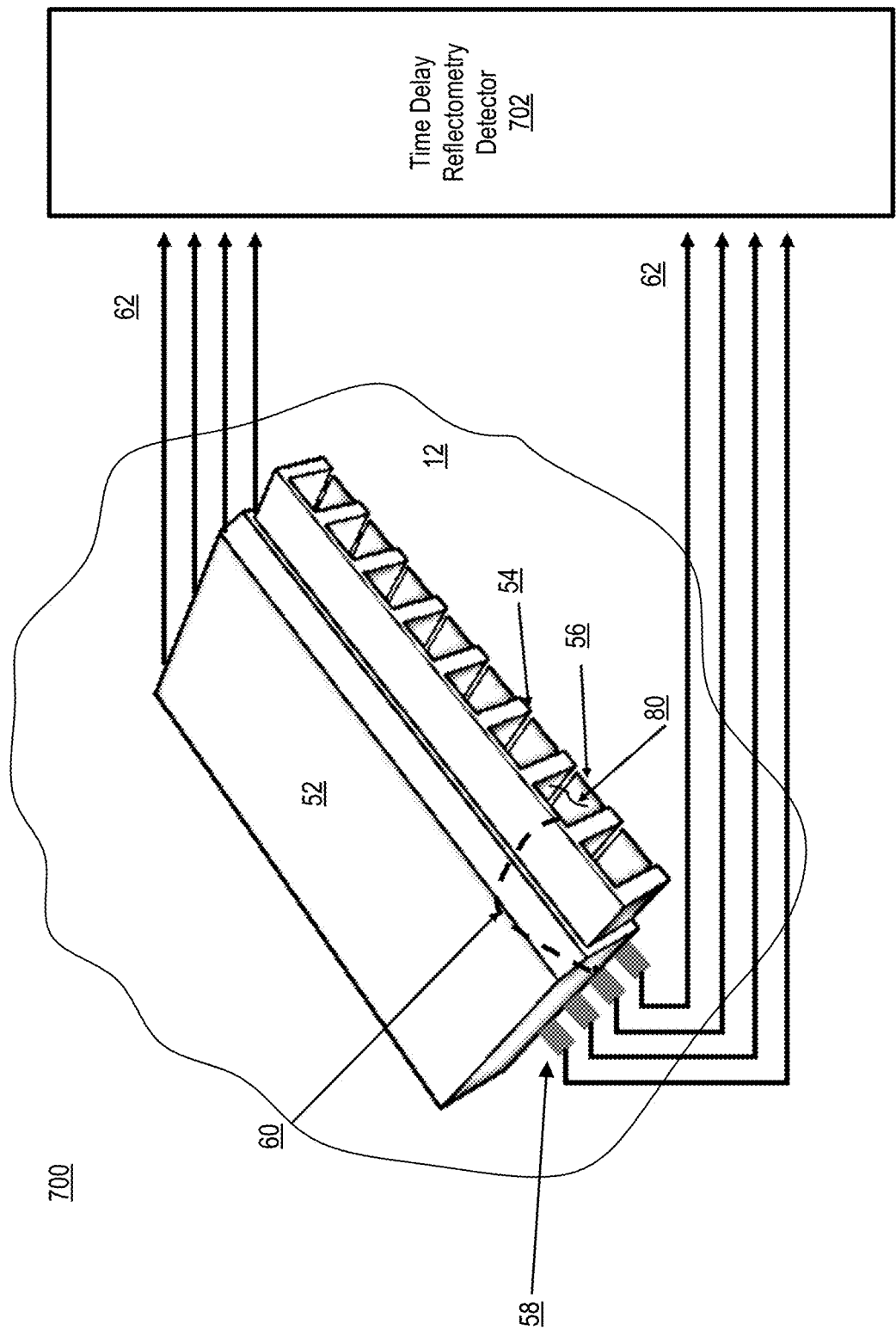
FIG. 11 illustrates an apparatus for tin whisker isolation and detection using time domain reflectometry (TDR) according to an exemplary embodiment.

FIG. 11 illustrates an apparatus 700 for tin whisker isolation and detection using time domain reflectometry (TDR) according to an exemplary embodiment. The apparatus 700 of FIG. 11 is similar to the apparatus 50 of FIG. 4 except that each of the case contacts 58 are connected via circuit connections 62 to a TDR detector 702. The TDR detector 702 is configured to isolate and characterize a tin whisker event via a reflected signal monitored from each of the cavities 54. As known in the art. TDR is sometimes used to detect the location of faults in transmission lines and coaxial cables. A low voltage pulsed signal is sent through the transmission line and a TDR meter checks for any reflections that may be due to a impedance mismatch. If there is no impedance mismatch throughout the line, no reflection occurs. However, if there is a discontinuity in the transmission line at a particular point, some part of the pulsed signal will be reflected back to the TDR meter. By measuring the time and propagation velocity of the received pulse, the TDR meter calculates the location of the fault and the nature of the fault, e.g., open circuit, short circuit, or impedance mismatch. Various embodiments described herein utilize TDR techniques to determine whether tin whisker growth has occurred as well as the location of such tin whisker growth.

In the embodiment of FIG. 11, the TDR detector 702 generates a series of pulses to each of the case contacts 58 of the shield 52 to function as monitoring points, determines whether a reflected signal is received back from one or more the case contacts 52 that is indicative of a tin whisker event caused by the growth of the whisker 80, and identifies the location of the whisker event by identifying the particular cavity 54. In a particular embodiment, the TDR detector 702 determines that a momentary short circuit has occurred between the tin whisker 80 and the cavity 54 based on the shape and characteristics of the reflected signal. In a particular embodiment, the TDR detector 702 uses differential TDR to detect extremely small tin whisker growth.

Figure 12:
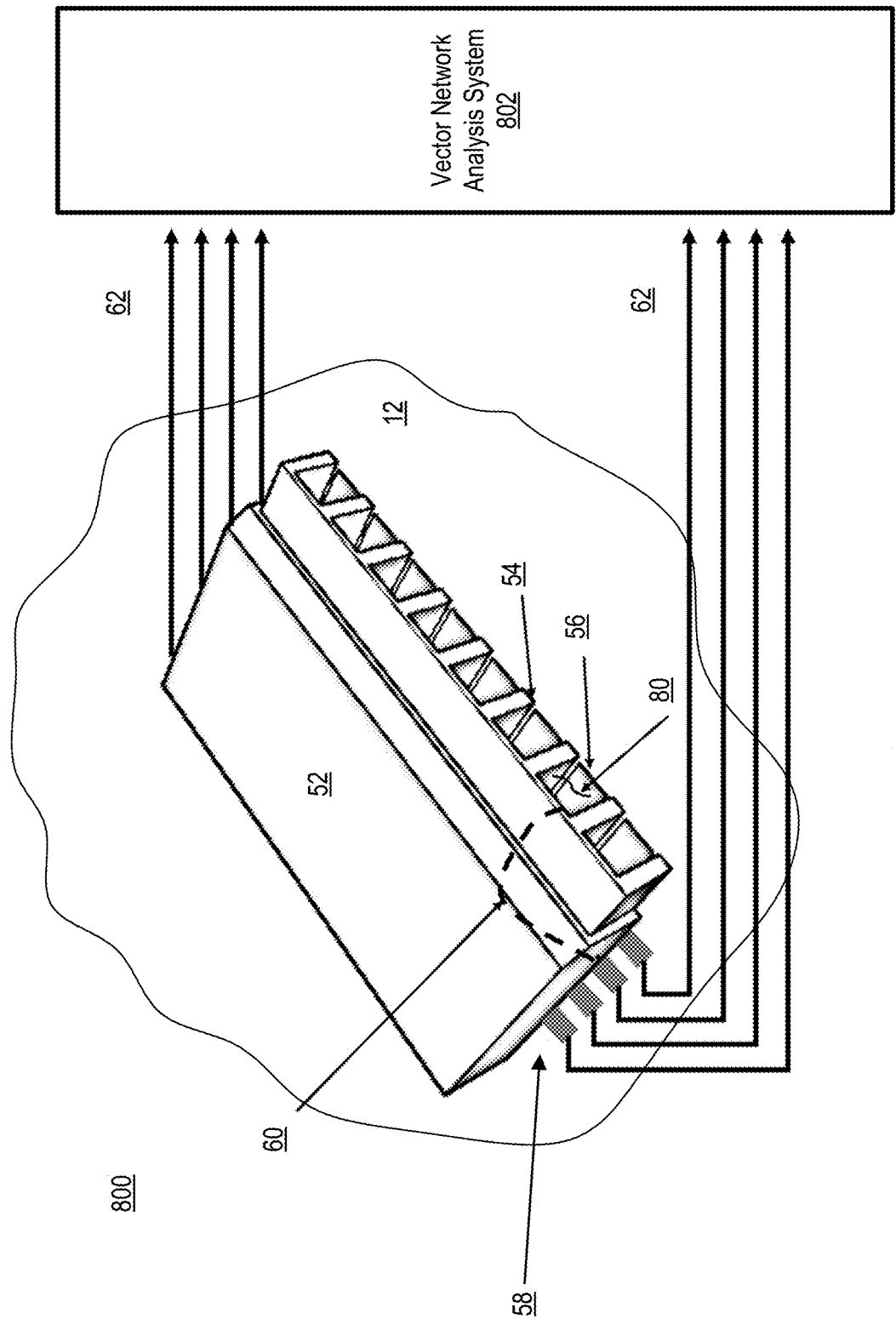
FIG. 12 illustrates an apparatus for tin whisker isolation and detection using vector network analysis (VNA) according to an exemplary embodiment.

FIG. 12 illustrates an apparatus 800 for tin whisker isolation and detection using vector network analysis (VNA) according to an exemplary embodiment. The apparatus 800 of FIG. 12 is similar to the apparatus 50 of FIG. 4 except that each of the case contacts 58 are connected via circuit connections 62 to a VNA system 802. The VNA system 802 is configured to isolate and characterize a tin whisker event to perform frequency domain analysis of the case contacts 58 using VNA techniques. The VNA system 802 uses a sensing circuit to characterize a tin whisker event by detecting a disruption in energy of the shield 52 of the card assembly if a whisker grows long enough to contact the cavity 54 of the shield 52.

The VNA system 802 learns the normal energy state of the card assembly including the shield 52 without a tin whisker event (e.g., −100 db). The VNA system 802 operates in the frequency domain to monitor networks disturbances that occur at the moment of a tin whisker shorting and fusing event. The individual case contacts 58 function as detection points and the VNA system 802 monitors the case contacts 58 to detect any disturbances in the network comprised of the on-board shield/barrier cases and their associated contact pins. Upon a whisker growth and fusing event, the VNA system 802 detects changes in the frequency distribution of the shield/barrier component that deviate from the normal state.

Figure 13A:
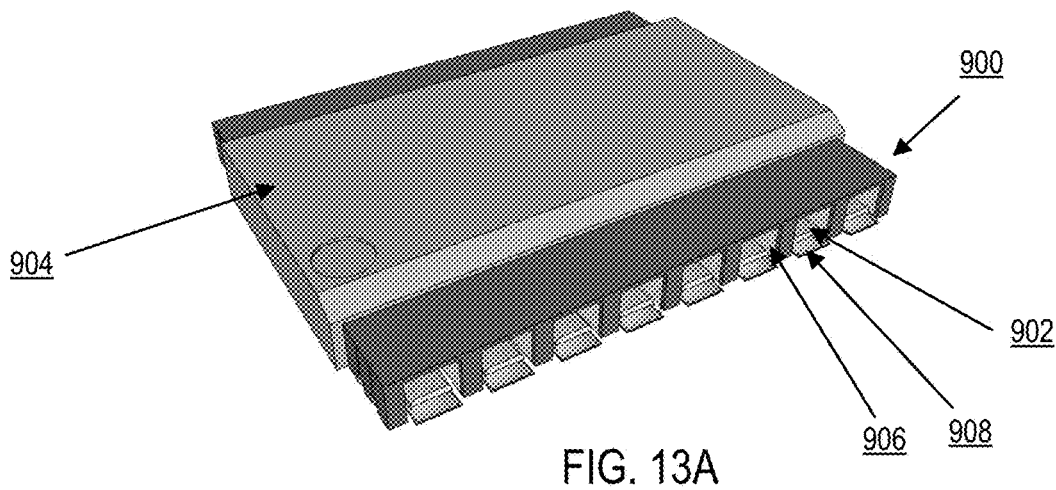
FIGS. 13A-13C illustrate an embodiment of a shield component according to an exemplary embodiment.
Figure 13B:
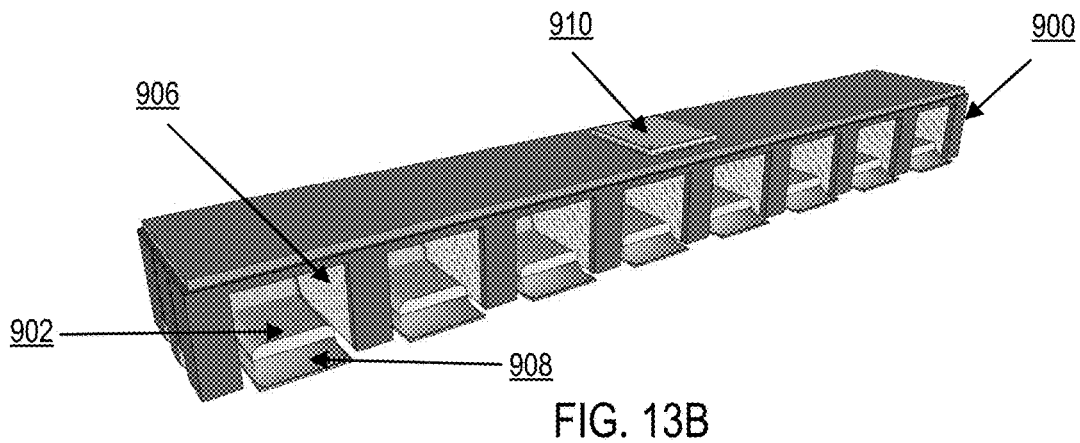
Figure 13C:
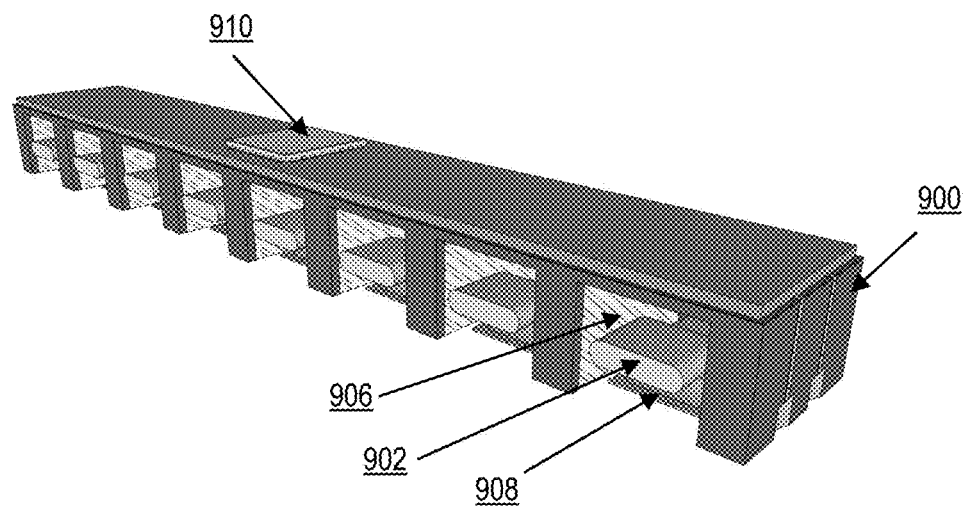

FIGS. 13A-13C illustrate an embodiment of a shield 900 according to an exemplary embodiment. FIG. 13A illustrates a perspective view of a shield 900 placed over leads 902 of a surface mount component 904. The shield 900 includes cavities 906 aligned over the leads 902 of the surface mount component 904 and corresponding pads 908 to which the leads 902 are soldered. In the particular embodiment illustrated in FIGS. 13A-13C, the shield 900 includes eight cavities 906 aligned over each leads/pads of the surface mount component. For illustration purposes, the cavities 906 are shown as being open at one end, however, in one or more implementations each of the cavities 906 includes an additional wall (not shown) fully enclosing the cavity 906.

FIG. 13B illustrates a front perspective view of the shield 900 further including sensor circuitry 910 disposed on a top surface of the shield 900. FIG. 13C illustrates a rear perspective cut-away view of the shield 900.

Figure 14:
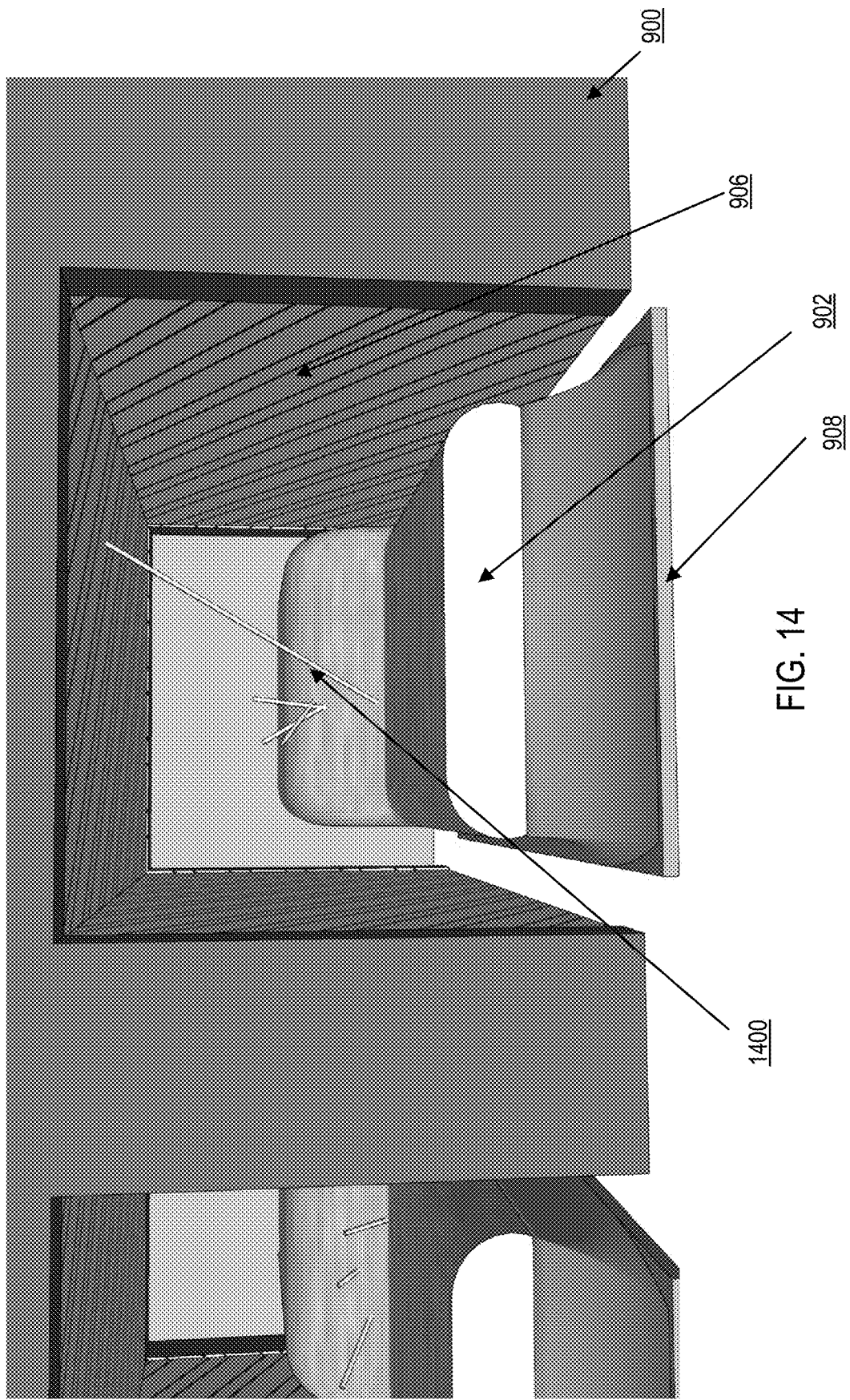
FIG. 14 illustrates an example of tin whisker growth within a cavity of the shield of FIGS. 13A-13C.

FIG. 14 illustrates an example of tin whisker growth within a cavity of the shield of FIGS. 13A-13C. In the example of FIG. 14, several tin whiskers 1400 are growing from the lead 902. The growth of tin whiskers 1400 is detected by one or more of the apparatus and methods for tin whisker isolation and detection as described herein with respect to various embodiments, For further explanation, FIG. 15 sets forth a flow chart illustrating an exemplary method for in whisker isolation and detection according to exemplary embodiments. For an apparatus having an electronic component placed on a substrate having a plurality of pads for connecting to the electronic component, the method includes placing a shield 1502 on a surface of a placing a shield on a surface of the substrate. The shield has a plurality of cavities aligned over the plurality of pads. An electrically conductive growth from a corresponding pad of the plurality of pads is sensed 1504 using a sensing component associated with one of the plurality of cavities. Each of the sensing components associated with one of a plurality of cavities.

One or more sensing signals from one or more of the sensing components are received 1506 by detection circuitry. The detection circuitry detects 1508 an electrically conductive growth from the corresponding pad based on the one or more sensing signals.

In an embodiment, detecting 1508 the electrically conductive growth from the corresponding pad further includes sensing a change in a magnetic field generated by a magnet within the cavity and generating the sensing signal based upon the change in the magnetic field. In another embodiment, detecting the electrically conductive growth further includes detecting the electrically conductive growth using time domain reflectometry (TDR). In still another embodiment, detecting the electrically conductive growth further includes detecting the electrically conductive growth using vector network analysis.

In an embodiment, the method further includes identifying 1510, by the detection circuitry, the pad having the electrically conductive growth based on the one or more sensing signals.

In an embodiment, the method further includes selecting one of the sensing signals and detecting the electrically conductive growth from the corresponding pad based on the selected sensing signal. In another embodiment, the method further includes outputting a status bit indicative of a location of the detected electrically conductive growth.

In view of the explanations set forth above, readers will recognize that the benefits of tin whisker isolation and detection according to embodiments of the present invention include providing for an enhanced whisker growth barrier that cannot be penetrated by a tin whisker and enhanced whisker sensing in which a whisker event, such as a momentary short-circuit, is identified.

It will be understood from the foregoing description that modifications and changes may be made in various embodiments of the present invention without departing from its true spirit. The descriptions in this specification are for purposes of illustration only and are not to be construed in a limiting sense. The scope of the present invention is limited only by the language of the following claims.

What is claimed is:

1. An apparatus for tin whisker isolation and detection, the apparatus comprising:
a substrate having a plurality of pads for connecting to an electronic component placed on the substrate;
a shield placed on a surface of the substrate, the shield having a plurality of cavities aligned over the plurality of pads;
a plurality of sensing components, each of the sensing components associated with one of the plurality of cavities and configured for sensing an electrically conductive growth from a corresponding pad of the plurality of pads;
a plurality of circuit connections, each of the plurality of circuit connections configured to separately connect one of the sensing components to detection circuitry; and
the detection circuitry configured to receive one or more sensing signals from one or more of the sensing components and detect an electrically conductive growth from the corresponding pad based on the one or more sensing signals.

2. The apparatus of claim 1, wherein the detection circuitry is configured to identify the pad having the electrically conductive growth based on the one or more sensing signals.

3. The apparatus of claim 1, further comprising a plurality of contacts, each of the plurality of contacts being coupled to an output of a corresponding one of the plurality of sensing components.

4. The apparatus of claim 3, wherein each of the plurality of contacts is further coupled to the detection circuitry.

5. The apparatus of claim 1, wherein one or more of the plurality of sensing components includes an operational amplifier.

6. The apparatus of claim 1, wherein the plurality of sensing components are contained within the shield.

7. The apparatus of claim 1, wherein the plurality of sensing components are placed on a another substrate, the another substrate mounted to an outer surface of the shield.

8. The apparatus of claim 1, wherein each of the plurality of sensing components includes a hall-effect sensor configured to sense a change in a magnetic field generated by a magnet within the cavity and generate the sensing signal based upon the change in the magnetic field.

9. The apparatus of claim 1, wherein the detection circuitry further comprises a selection matrix coupled to each of the plurality of sensing components, the selection matrix being configured to select one of the sensing signals and detect the electrically conductive growth from the corresponding pad based on the selected sensing signal.

10. The apparatus of claim 1, wherein the detection circuitry is configured to output a status bit indicative of a location of the detected electrically conductive growth.

11. The apparatus of claim 1, wherein the detection circuitry is configured to detect the electrically conductive growth using time domain reflectometry.

12. The apparatus of claim 1, wherein the detection circuit is configured to detect the electrically conductive growth using vector network analysis.

13. The apparatus of claim 1, wherein the shield is formed of a metalized ceramic substrate.

14. A method of detecting a tin whisker in an apparatus having an electronic component placed on a substrate having a plurality of pads for connecting to the electronic component, the method comprising:

placing a shield on a surface of the substrate, the shield having a plurality of cavities aligned over the plurality of pads;

sensing an electrically conductive growth from a corresponding pad of the plurality of pads using a sensing component of a plurality of sensing components respectively associated with the plurality of cavities, each of the sensing components separately connected to detection circuitry;

receiving, by the detection circuitry, one or more sensing signals from one or more of the sensing components; and detecting, by the detection circuitry, an electrically conductive growth from the corresponding pad based on the one or more sensing signals.

15. The method of claim 14, further comprising identifying, by the detection circuitry, the pad having the electrically conductive growth based on the one or more sensing signals.

16. The method of claim 14, wherein detecting the electrically conductive growth from the corresponding pad further comprises sensing a change in a magnetic field generated by a magnet within the cavity and generating the sensing signal based upon the change in the magnetic field.

17. The method of claim 14, further comprising selecting one of the sensing signals and detecting the electrically conductive growth from the corresponding pad based on the selected sensing signal.

18. The method of claim 14, outputting a status bit indicative of a location of the detected electrically conductive growth.

19. The method of claim 14, wherein detecting the electrically conductive growth further comprises detecting the electrically conductive growth using time domain reflectometry.

20. The method of claim 14, wherein detecting the electrically conductive growth further comprises detecting the electrically conductive growth using vector network analysis.

* * * * *